United States Patent
Kang et al.

(10) Patent No.: US 8,076,669 B2
(45) Date of Patent: Dec. 13, 2011

(54) ORGANIC LIGHT EMITTING DISPLAY AND METHOD OF MANUFACTURING THE SAME

(75) Inventors: Chul-kyu Kang, Suwon-si (KR); Byoung-keon Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 689 days.

(21) Appl. No.: 12/098,631

(22) Filed: Apr. 7, 2008

(65) Prior Publication Data

US 2009/0072258 A1 Mar. 19, 2009

(30) Foreign Application Priority Data

Sep. 14, 2007 (KR) .................. 10-2007-0093629

(51) Int. Cl.
*H01L 29/08* (2006.01)
*H01L 35/24* (2006.01)
*H01L 51/00* (2006.01)

(52) U.S. Cl. .......... 257/40; 257/233; 257/290; 257/458; 257/544; 257/E33.046; 257/E27.133; 349/61; 349/43; 349/116; 345/207; 313/498; 313/499; 313/510; 313/511; 313/512; 362/257

(58) Field of Classification Search .................. 257/40, 257/59, 72, 82, 233, 290, 431, 436, 458, 257/538, 544, E33.046, E27.133; 349/61, 349/43, 116; 345/207; 313/498–512; 362/257
See application file for complete search history.

(56) References Cited

U.S. PATENT DOCUMENTS

| | | | |
|---|---|---|---|
| 2003/0063081 A1* | 4/2003 | Kimura et al. | 345/211 |
| 2004/0201548 A1* | 10/2004 | Watanabe et al. | 345/30 |
| 2004/0263069 A1* | 12/2004 | Yamazaki et al. | 313/506 |
| 2005/0045881 A1* | 3/2005 | Nakamura et al. | 257/59 |
| 2006/0030084 A1* | 2/2006 | Young | 438/149 |
| 2006/0273999 A1* | 12/2006 | Yamazaki et al. | 345/81 |
| 2007/0093007 A1* | 4/2007 | Deane | 438/154 |
| 2007/0138951 A1* | 6/2007 | Park et al. | 313/504 |
| 2007/0164293 A1* | 7/2007 | Hamano et al. | 257/79 |
| 2007/0257254 A1* | 11/2007 | Yang et al. | 257/40 |

(Continued)

FOREIGN PATENT DOCUMENTS

JP 03-232279 10/1991

(Continued)

OTHER PUBLICATIONS

European Search Report issued in European Patent Application No. 08164244.9 on Apr. 6, 2009.

(Continued)

*Primary Examiner* — Lynne Gurley
*Assistant Examiner* — Meiya Li
(74) *Attorney, Agent, or Firm* — H.C. Park & Associates, PLC

(57) ABSTRACT

An organic light emitting display includes an organic light emitting diode formed on a substrate, coupled to a transistor; a photodiode formed on the substrate and including a semiconductor layer including a high-concentration P doping region, an intrinsic region with defects and a high-concentration N doping region; and a controller that uniformly controls the luminance of light emitted from the organic light emitting diode by controlling a voltage applied to the first electrode and the second electrode according to the voltage outputted from the photodiode.

3 Claims, 4 Drawing Sheets

U.S. PATENT DOCUMENTS

| | | | |
|---|---|---|---|
| 2007/0273291 A1* | 11/2007 | Choi et al. | 315/158 |
| 2007/0273292 A1* | 11/2007 | Choi et al. | 315/158 |
| 2007/0285942 A1* | 12/2007 | Yang et al. | 362/608 |
| 2008/0158137 A1* | 7/2008 | Yoshida | 345/102 |
| 2008/0185596 A1* | 8/2008 | Tseng et al. | 257/84 |
| 2008/0203279 A1* | 8/2008 | Kobashi | 250/216 |
| 2008/0204642 A1* | 8/2008 | Kobashi | 349/116 |
| 2008/0224143 A1* | 9/2008 | Kim et al. | 257/59 |
| 2009/0135325 A1* | 5/2009 | Koide et al. | 349/43 |
| 2009/0162961 A1* | 6/2009 | Deane | 438/34 |

FOREIGN PATENT DOCUMENTS

| | | |
|---|---|---|
| JP | 10-163517 | 6/1998 |
| JP | 2005-116681 | 4/2005 |
| JP | 2006-80306 | 3/2006 |
| JP | 2006-091462 | 4/2006 |
| JP | 2007-173832 | 7/2007 |
| JP | 2007-184595 | 7/2007 |
| JP | 2007-524197 | 8/2007 |
| KR | 2005-9211 | 1/2005 |
| KR | 2005-31397 | 4/2005 |
| KR | 2005-121090 | 12/2005 |
| KR | 2006-58573 | 5/2006 |
| KR | 2006-77138 | 7/2006 |
| KR | 10-722111 | 5/2007 |
| KR | 10-759689 | 9/2007 |
| KR | 10-769432 | 10/2007 |
| KR | 10-821070 | 4/2008 |
| WO | WO 2004/109641 | 12/2004 |
| WO | WO 2005/059971 | 6/2005 |
| WO | WO 2005/081810 | 9/2005 |
| WO | WO 2005/093700 | 10/2005 |

OTHER PUBLICATIONS

Japanese Office Action issued on Apr. 23, 2010.

* cited by examiner

ORGANIC LIGHT EMITTING DISPLAY AND METHOD OF MANUFACTURING THE SAME

CROSS-REFERENCE TO RELATED APPLICATIONS

This application claims the benefit of Korean Application No. 2007-93629 filed on Sep. 14, 2007 in the Korean Intellectual Property Office, the disclosure of which is incorporated herein by reference.

BACKGROUND OF THE INVENTION

1. Field of the Invention

Aspects of the present invention relate to an organic light emitting display and a method of manufacturing the same. More particularly, aspects of the present invention relate to an organic light emitting display including a photodiode including a light receiver in which a defect site is formed by subjecting the light receiver to a dry etching process, and a method of manufacturing the same.

2. Description of the Related Art

An organic light emitting display is a next-generation display device having a self-light emitting characteristic. The organic light emitting display has excellent physical properties in terms of viewing angle, contrast, response time and power consumption, compared to the liquid crystal display device (LCD).

The organic light emitting display includes an organic light emitting diode comprising an anode electrode, an organic thin film layer and a cathode electrode. Types of organic light emitting displays include a passive matrix display where organic light emitting diodes are coupled between scan lines and signal lines in a matrix mode to constitute pixels; and an active matrix display where operation of each of the pixels is controlled by a thin film transistor (TFT) that functions as a switch.

However, the organic light emitting display has a problem that, since the organic thin film layer emitting the light is made of organic materials, characteristics of the organic materials deteriorate with time, which leads to a low luminance of the emitted light. Also, the contrast of the organic light emitting display is worsened by the reflection of light incident from the outside.

SUMMARY OF THE INVENTION

Accordingly, aspects of the present invention provide an organic light emitting display including a photodiode to adjust the luminance of the emitted light according to the intensity of light incident from the outside, and a method of manufacturing the same.

Aspects of the present invention also provide an organic light emitting display capable of enhancing the light receiving efficiency of a photodiode, and a method of manufacturing the same.

According to an embodiment of the present invention, there is provided an organic light emitting display including an organic light emitting diode formed on a substrate, coupled to a transistor including a gate, a source and a drain, and including a first electrode, an organic thin film layer and a second electrode; a photodiode formed on the substrate and a semiconductor layer including a high-concentration P doping region, an intrinsic region with defects and a high-concentration N doping region, all of which are attached to each other; and a controller for uniformly controlling luminance of the light emitted from the organic light emitting diode by controlling a voltage, applied to the first electrode and the second electrode, according to the voltage outputted from the photodiode.

According to an embodiment of the present invention, there is provided an organic light emitting display, comprising an organic light emitting diode; a photodiode formed on a substrate; a controller that controls a luminance of light emitted from the organic light emitting diode by controlling a voltage applied to an electrode of the organic light emitting diode according to a voltage outputted from the photodiode; and a reflective layer between an upper surface of the substrate and a lower surface of the photodiode.

According to another embodiment of the present invention, there is provided a method of manufacturing an organic light emitting display including forming a first semiconductor layer and a second semiconductor layer on a buffer layer formed on a substrate; forming a photodiode on the first semiconductor layer, the photodiode including a high-concentration P doping region, an intrinsic region and a high-concentration N doping region, and forming source/drain regions and channel region on the second semiconductor layer; forming a gate insulator on the entire surface including the first and second semiconductor layers, followed by forming a gate electrode on the gate insulator disposed on the channel region; and forming an interlayer insulator on the gate insulator and the gate electrode, and patterning the interlayer insulator and the gate insulator using a dry etching process to form contact hole so as to expose the source/drain region, the high-concentration P doping region and the high-concentration N doping region, followed by exposing the intrinsic region.

According to another embodiment of the present invention, there is provided a method of manufacturing an organic light emitting display, the method comprising forming a photodiode on a substrate, the photodiode comprising a first semiconductor layer including a P doping region, an intrinsic region and an N doping region; forming a thin film transistor on the substrate; forming at least one insulating layer on the photodiode; and patterning the at least one insulating layer by dry etching to expose the intrinsic region of the first semiconductor layer, wherein the dry etching to expose the intrinsic region of the first semiconductor layer creates defect sites in the intrinsic region.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of embodiments, taken in conjunction with the accompanying drawings of which.

DETAILED DESCRIPTION OF THE EMBODIMENTS

Figure 1:
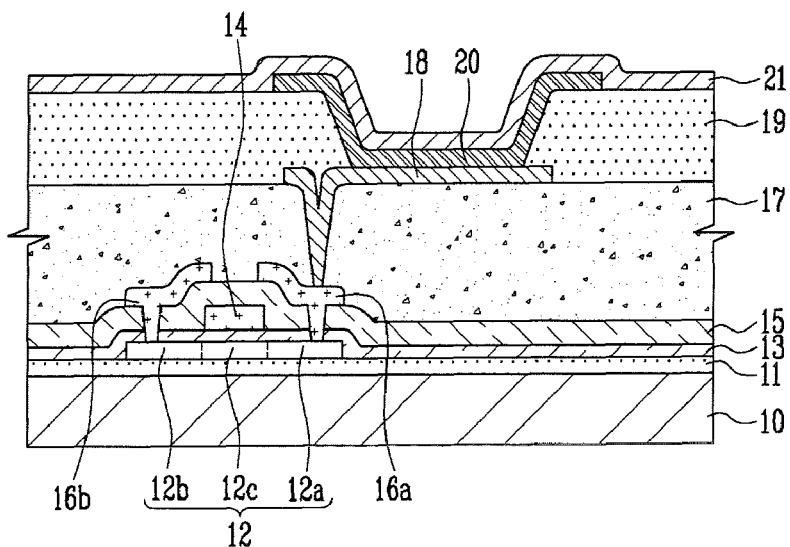
FIG. 1 is a schematic cross-sectional view showing a conventional organic light emitting display including a thin film transistor.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Aspects of the present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or an element is referred to as being "on" another layer, element or substrate, it can be directly on the other layer, element or substrate, or intervening layers or elements may also be present. Further, it will be understood that when a layer or an element is referred to as being "under" another layer or element, it can be directly under, or one or more intervening layers or elements may also be present. In addition, it will also be understood that when a layer or an element is referred to as being "between" two layers or elements, it can be the only layer or element between the two layers or elements, or one or more intervening layers or elements may also be present. Like reference numerals refer to like elements throughout.

FIG. 1 is a schematic cross-sectional view showing an organic light emitting display including a thin film transistor. A buffer layer 11 is formed on a substrate 10, and a semiconductor layer 12 providing source/drain regions 12a and 12b, and a channel region 12c is formed on the buffer layer 11. A gate electrode 14 that is insulated with the semiconductor layer 12 by the gate insulator 13 is formed on the semiconductor layer 12, and an interlayer insulator 15 is formed along the entire upper surface including the gate electrode 14. The interlayer insulator 15 has contact holes formed therein to expose the source/drain regions 12a and 12b. Source/drain electrodes 16a and 16b coupled to the source/drain regions 12a and 12b through the contact holes are formed on the interlayer insulator 15, and an overcoat 17 is formed in the entire upper surface including the source/drain electrodes 16a and 16b. The overcoat 17 has via holes formed therein to expose the source or drain electrodes 16a or 16b. An anode electrode 18 and a pixel definition layer 19 are formed on the overcoat 17, the anode electrode 18 being coupled to the source or drain electrodes 16a or 16b through the via holes, and the pixel definition layer 19 functioning to expose a predetermined region of the anode electrode 18 for the purpose of defining a light emission region. An organic thin film layer 20 and a cathode electrode 21 are formed on the anode electrode 18.

In the operation of the organic light emitting display described above, when a predetermined voltage is applied between the anode electrode 18 and the cathode electrode 21, electrons injected through the cathode electrode 21 are recombined in the organic thin film layer 20 with holes injected through the anode electrode 18 and light is emitted.

Characteristics of organic materials constituting a light emitting layer of the organic light emitting display deteriorate with time, and therefore the luminance of emitted light is also lowered in the organic light emitting display. In order to solve the above-mentioned problems, the present inventors have found that the luminance of the emitted light can be uniformly controlled by detecting the light incident from the outside or the light emitted inwardly, using a photodiode. However, as display devices become smaller and thinner, the light-receiving area and efficiency of the photodiode become worse, since the photodiode is also decreased in size.

Figure 2:
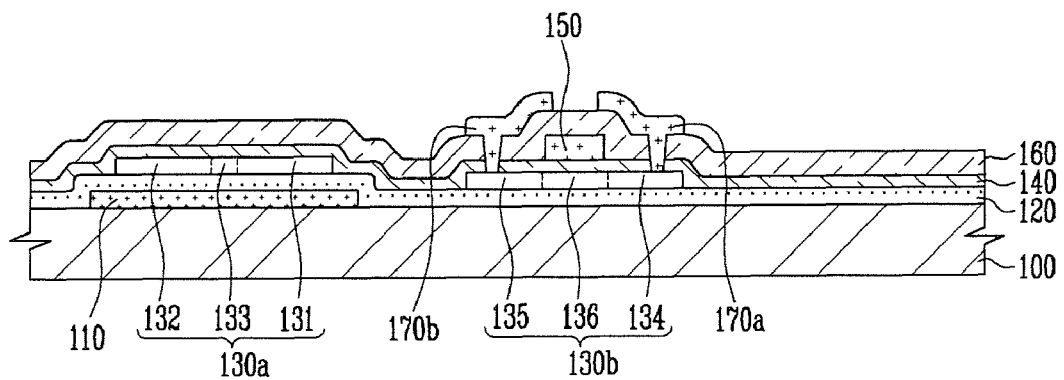
FIG. 2 is a cross-sectional view showing an organic light emitting display including a photodiode according to an embodiment of the present invention.

FIG. 2 is a cross-sectional view showing an organic light emitting display including a photodiode according to an embodiment of the present invention. As shown in FIG. 2, a reflective layer 110 is formed in a predetermined region of the substrate 100. The reflective layer 110 is formed in a non-light emission region adjacent to the light emission region and made of metals such as Ag, Mo, Ti, Al or Ni. When light from the outside is incident to the photodiode, light rays that passes through the photodiode and light rays that travel toward the substrate are reflected by the reflective layer 110, and reenter the photodiode. Therefore, the light receiving efficiency of the photodiode is improved.

A buffer layer 120 is formed on the entire surface of the substrate 100 including the reflective layer 110. A semiconductor layer 130a is formed on the buffer layer 120, the semiconductor layer 130a comprising a high-concentration P doping region 131, a high-concentration N doping region 132 and an intrinsic region 133, thereby forming a photodiode. A semiconductor layer 130b is formed on the buffer layer 120 in a region adjacent to the semiconductor layer 130a, the semiconductor layer 130b including source/drain regions 134 and 135 and a channel region 136. A gate insulator 140 is formed on the semiconductor layers 130a and 130b, and a gate electrode 150 insulated from the semiconductor layer 130b by the gate insulator 140 is formed on the semiconductor layer 130b. An interlayer insulator 160 is formed on the entire upper surface including the gate electrode 150. The interlayer insulator 160 has contact holes formed therein to expose the source/drain regions 134 and 135. Source/drain electrodes 170a and 170b are formed on the interlayer insulator 160 and are coupled to the source/drain regions 134 and 135 through the contact holes.

The remaining components of the organic light emitting display are identical to those of the conventional organic light emitting display illustrated in FIG. 1 and therefore are not shown again in FIG. 2. In particular, an overcoat (such as, for example, overcoat 17 shown in FIG. 1) is formed on the entire upper surface of the structure shown in FIG. 2, including the source/drain electrodes 170a and 170b. The overcoat has a via hole formed therein to expose the source or drain electrode. And, an anode electrode and a pixel definition layer (such as, for example, anode electrode 18 and pixel definition layer 19 shown in FIG. 1) are formed on the overcoat, the anode electrode being coupled to the source or drain electrodes 170a or 170b through the via hole, and the pixel definition layer functioning to expose a predetermined region of the anode electrode as to define a light emission region. An organic thin film layer and a cathode electrode (such as, for example, the organic film layer 20 and the cathode electrode 21 shown in FIG. 1) are formed on the anode electrode. The organic thin film layer may be formed with a structure including a hole transfer layer, an organic light emitting layer and an electron transfer layer, which are laminated sequentially, and may further include a hole injecting layer and an electron injecting layer.

As described above, the organic light emitting diode, comprising an anode electrode, an organic thin film layer and a cathode electrode, emits light due to the difference in energy generated in the recombination of holes and electrons. If a predetermined voltage is applied to the anode electrode and the cathode electrode, holes injected through the anode electrode and electrons injected through the cathode electrode are recombined in the organic thin film layer. When the light is emitted outwardly as described above, the light from external light sources is incident to the organic light emitting display. The photodiode, made of the semiconductor layer 130a, which comprises of the high-concentration P doping region 131, the high-concentration N doping region 132 and the intrinsic region 133, receives the light incident from the outside and generates an electrical signal according to the intensity of the light.

The photodiode is a semiconductor device that converts an optical signal into an electrical signal. The photodiode is in a reverse bias state, that is, a negative (−) voltage is applied to the high-concentration P doping region 131 and a positive (+) voltage applied to the high-concentration N doping region 132. When light is incident on the photodiode in the reverse bias state, an electric current flows as electrons and holes move along the depletion region formed on the intrinsic region 133. As a result, a voltage that is in proportion to the intensity of the light is outputted.

In the operation of the light emitting diode, a controller receives a voltage outputted from the photodiode and controls a voltage applied to the light emitting diode. Therefore, the intensity of the light emitted by the organic light emitting display may be controlled by the intensity of the light incident from the outside, and therefore it is possible to uniformly control the luminance of the emitted light in the organic light emitting display.

As described above, when light from the outside is incident to the photodiode, light that is transmitted through the photodiode toward the substrate is reflected by the reflective layer 110 and reenters the photodiode. Therefore, the light receiving efficiency of the photodiode is improved.

Generally, the semiconductor layer 130a constituting the photodiode is made of polysilicon, but it may be difficult to obtain a sufficient light receiving efficiency since the semiconductor layer 130a is formed at a thickness of about 500 Å. Also, as display devices become smaller and thinner, the light-receiving efficiency of the photodiode becomes worse, since the photodiode is also decreased in size. However, according to aspects of the present invention, because of the increase in light receiving efficiency provided by the reflective layer 110, it is possible to provide a smaller photodiode and display device.

Figure 3A:
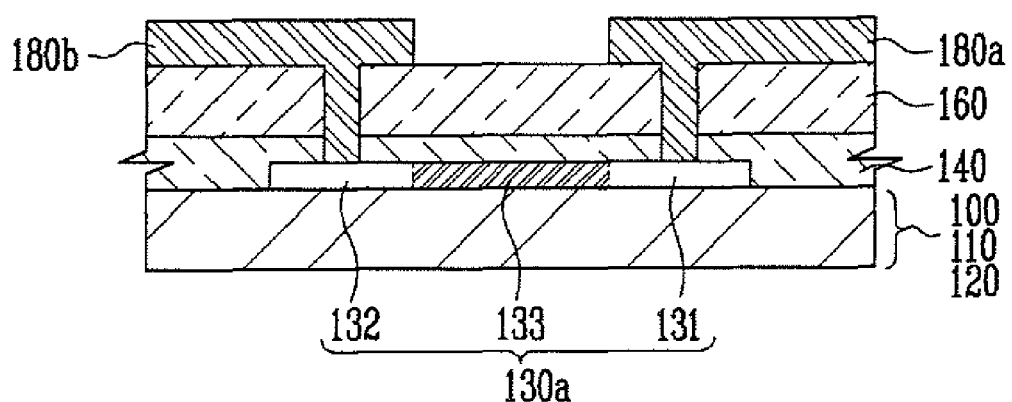
FIG. 3A is a schematic view showing a semiconductor layer, and its upper layer, of the photodiode according to an embodiment of the present invention.

FIG. 3A is a schematic view showing a semiconductor layer 130a and upper layers of the photodiode according to an embodiment of the present invention. As shown in FIG. 3A, the semiconductor layer 130a of the photodiode is formed on the substrate 100, the reflective layer 110 and the buffer layer 120 The semiconductor layer 130a is made of polysilicon. The semiconductor layer 130a comprises a high-concentration P doping region 131, an intrinsic region 133 and a high-concentration N doping region 132. In a photodiode having such a general PIN structure, electrons-hole pairs are generated mainly in the intrinsic region 133, which is the central region of the semiconductor layer. A gate insulator 140 and an interlayer insulator 160 are formed on the semiconductor layer. Electrodes 180a, 180b coupled respectively to the high-concentration P doping region 131 and the high-concentration N doping region 132 are formed on the semiconductor layer after contact holes are formed using a dry etching process.

Figure 3B:
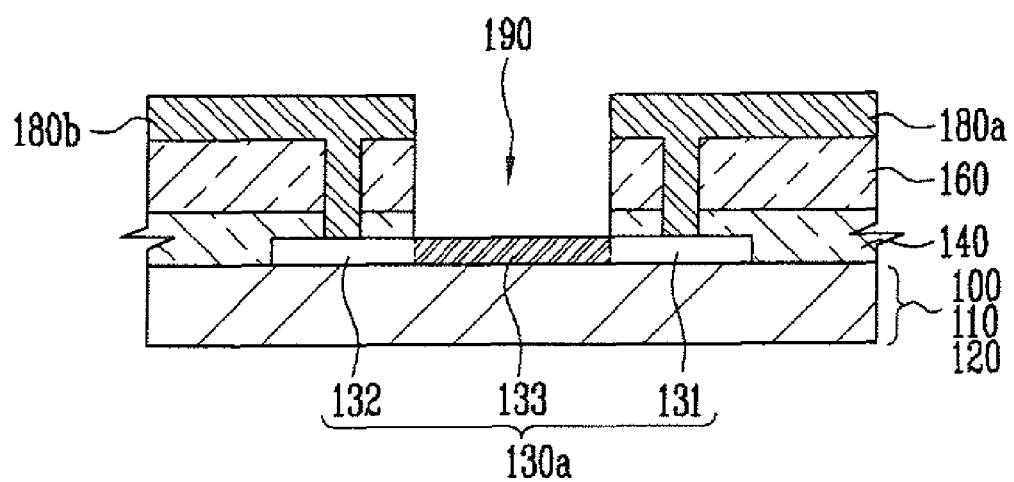
FIG. 3B is a schematic view showing a semiconductor layer, and its upper layer, of the photodiode according to another embodiment of the present invention.

The semiconductor layers 130a, 130b may be made of poly-silicon. Since a photodiode made of the poly silicon has a lower sensitivity to light than a photodiode made of amorphous silicon, a photodiode as shown in FIG. 3B may be provided herein to provide an increased transmission of light to the photodiode. FIG. 3B is a schematic view showing the semiconductor layer and upper layers of the photodiode. As shown in FIG. 3B, the semiconductor layer 130a of the photodiode is formed on the substrate 100, the reflective layer 110 and the buffer layer 120. The semiconductor layer 130a is made of poly silicon. The semiconductor layer 130a comprises a high-concentration P doping region 131, an intrinsic region 133 and a high-concentration N doping region 132. A gate insulator 140 and an interlayer insulator 160 are formed on the semiconductor layer.

Typically, contact holes are formed only through dry etching, but in this embodiment, a light receiver 190 on the intrinsic region 133 is also dry etched In particular, contact holes and the light receiver 190 are formed through the dry etching process and electrodes 180a, 180b are provided, the electrodes 180a, 180b being coupled respectively to the high-concentration P doping region 131 and the high-concentration N doping region 132. The light receiver 190 formed by the dry etching exposes the intrinsic region 133.

Figure 3C:
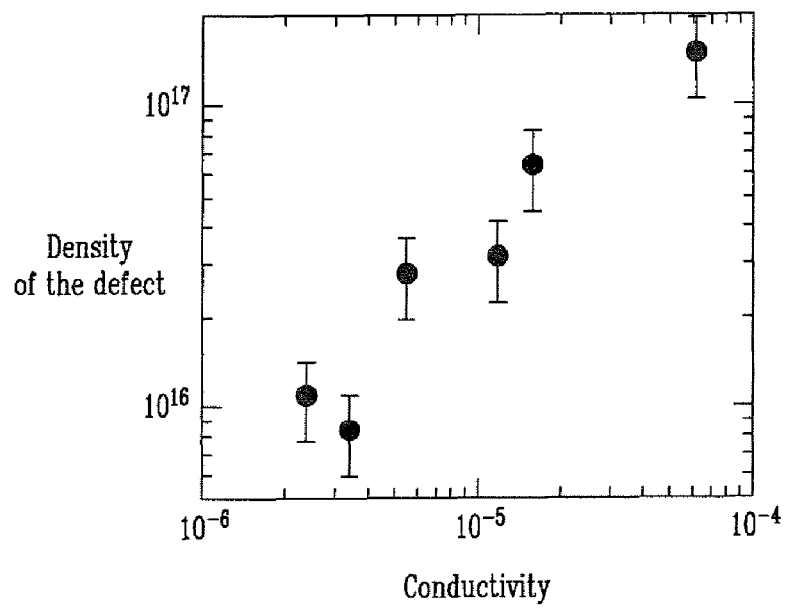
FIG. 3C is a graph showing conductivity by the light according to the density of defects.

When dry etching is carried out, the polysilicon of the intrinsic region 133 of the semiconductor layer 130a is damaged by plasma (plasma damage), and therefore defect sites are generated in the intrinsic region 133. In this instance, plasma damage is desirable because the defect sites increase the generation of electrons-hole pairs in response to light, as shown in FIG. 3C, which is a graph showing conductivity to the light according to the density of defects. As shown in FIG. 3C, it has been experimentally revealed that conductivity to light is increased if the density of defects per unit volume (1 $cm^3$) increases. Therefore, the dry etching process is intentionally carried out to increase the defects in the intrinsic region 133, thereby inducing the increase in the generation of the electrons-hole pairs by the light.

Hereinafter, the method of manufacturing an organic light emitting display including the photodiode shown in FIG. 3C and a thin film transistor will be described in detail with reference to FIGS. 4A to 4E.

Figure 4A:
FIGS. 4A to 4E are cross-sectional views showing a method of manufacturing an organic light emitting display according to an embodiment of the present invention.

Referring to FIG. 4A, a metal such as Ag, Mo, Ti, Al or Ni is deposited on the substrate 100 using a sputtering process, etc., and then patterned using exposure and development processes using a predetermined mask to form a reflective layer 110 in a predetermined region. The metal used to form the reflective layer 110 is deposited at a suitable thickness, such as, for example 100 to 5000 Å, to reflect light.

The reflective layer 110 may be formed at a wider range than the semiconductor layer 130a so as to effectively reflect light rays traveling toward the substrate 100.

Figure 4B:
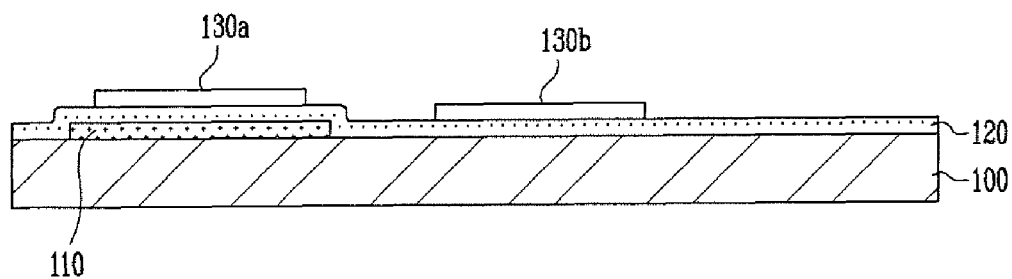

Referring to FIG. 4B, a buffer layer 120 and a semiconductor layer 130 are sequentially formed on the entire surface of the substrate 100 including the reflective layer 110, and the semiconductor layer 130 is then patterned so that the semiconductor layer 130a of the photodiode is located on the reflective layer 110 and the semiconductor layer 130b of the thin film transistor is located on the buffer layer 120 of a region adjacent to the reflective layer 110. The buffer layer 120 prevents damages to the substrate 100 by the heat, and is formed of an insulator material such as a silicon oxide film ($SiO_2$) or a silicon nitride film ($SiN_x$) The semiconductor layer 130 is formed of amorphous silicon or polysilicon. If the buffer layer 120 is made of amorphous silicon, the amorphous silicon may be crystallized through the heat treatment.

Figure 4C:
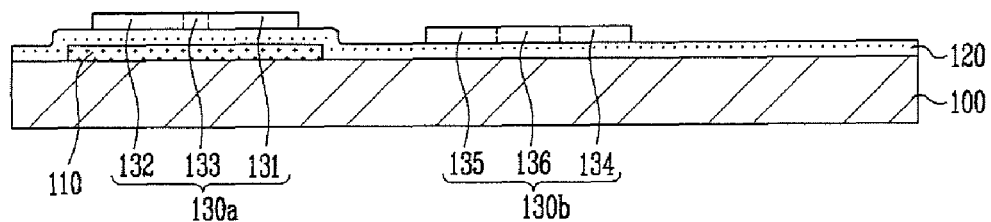

Referring to FIG. 4C, the semiconductor layer 130a that forms the photodiode is provided with a high-concentration P doping region 131 formed by a P-type impurity ion implantation process, a high-concentration N doping region 132 formed by an N-type impurity ion implantation process and an intrinsic region 133. Source/drain regions 134 and 135 and a channel region 136 are formed in the semiconductor layer 130b that forms the thin film transistor. Therefore, a photodiode provided with the high-concentration P doping region 131, the high-concentration N doping region 132 and the intrinsic region 133 is formed in one semiconductor layer 130a, and a transistor comprising the source/drain regions 134 and 135 and the channel region 136 between the source/drain regions 134 and 135 is formed in another semiconductor layer 130b.

Figure 4D:
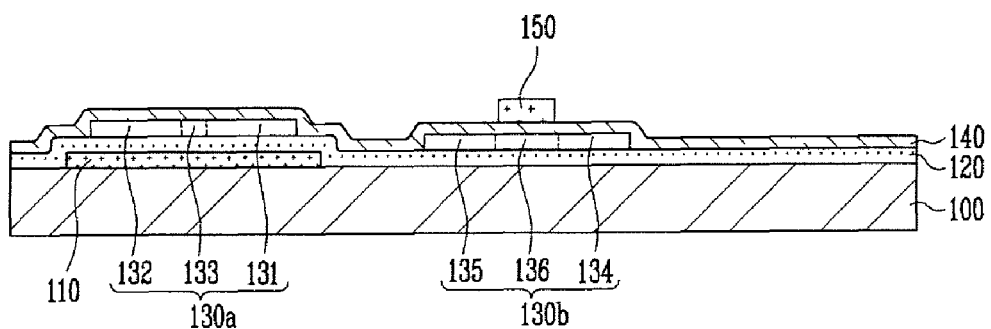

Referring to FIG. 4D, a gate insulator 140 is formed on the entire surface including the semiconductor layers 130a and 130b. A gate electrode 150 is then formed on the portion of the gate insulator 140 formed on the channel region 136.

Figure 4E:
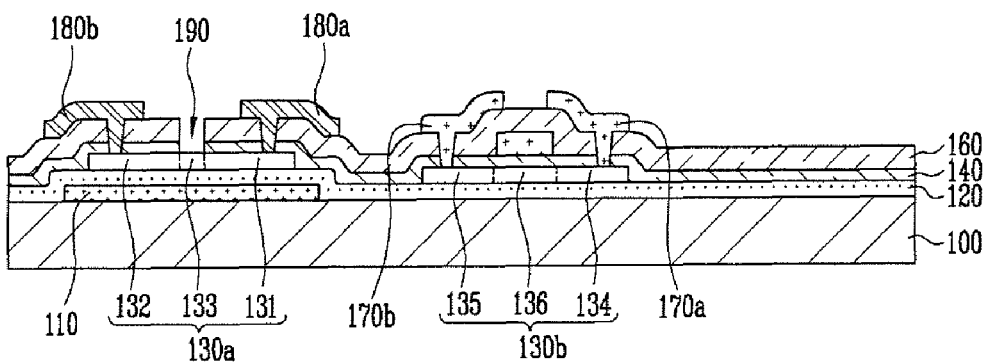

Referring to FIG. 4E, an interlayer insulator 160 is formed on the entire surface including the gate electrode 150. Portions of the interlayer insulator 160 and the gate insulator 140 located over the semiconductor layer 130b are patterned using a dry etching process to form contact holes so as to expose the source/drain regions 134 and 135 of the semiconductor layer 130b. Source/drain electrodes 170a and 170b are formed to connect to the source/drain regions 134 and 135 through the contact holes.

Also, portions of the interlayer insulator 160 and the gate insulator 140 located over the semiconductor layer 140a are patterned using dry etching to form contact holes to expose the high-concentration P doping region 131 and the high-concentration N doping region 132 of the semiconductor layer 130a. Electrodes 180a and 180b are formed to connect to the high-concentration P doping region 131 and the high-concentration N doping region 132, respectively, through the contact holes.

Further, a portion of the gate insulator 140 and the interlayer insulator 160 over the intrinsic region 133 of the semiconductor layer 130a is also dry etched to form the light receiver 190. In the dry etching, the polysilicon of the intrinsic region 133 of the semiconductor layer 130a is damaged by plasma (plasma damage), and therefore, defect sites are generated in the intrinsic region 133. As a result, the generation of electrons-hole pairs in response to light is increased.

Thereafter, an overcoat (such as, for example, overcoat 17 shown in FIG. 1) may be formed on the entire upper surface of the structure shown in FIG. 4E, including on the photodiode and the thin film transistor. The overcoat 17 may have a via hole formed therein to expose the source or drain electrodes 170a and 170b. An anode electrode and a pixel definition layer (such as, for example, anode electrode 18 and pixel definition layer 19 shown in FIG. 1) may be formed on the overcoat, the anode electrode being coupled to the source or drain electrodes 170a or 170b through the via hole, and the pixel definition layer functioning to expose a predetermined region of the anode electrode as to define a light emission region. An organic thin film layer and a cathode electrode (such as, for example, the organic film layer 20 and the cathode electrode 21 shown in FIG. 1) may be formed on the anode electrode. The organic thin film layer may be formed with a structure including a hole transfer layer, an organic light emitting layer and an electron transfer layer, which are laminated sequentially, and may further include a hole injecting layer and an electron injecting layer.

It is to be understood that other structures may be used for the light emitting diode and the thin film transistor.

As described above, aspects of the present invention provide an organic light emitting display including a photodiode to adjust the luminance of the emitted light according to the intensity of the light incident from the outside, and a method of manufacturing the same. Also, aspects of the present invention provide an organic light emitting display capable of enhancing the light receiving efficiency of a photodiode, and a method of manufacturing the same.

Although a few embodiments of the present invention have been shown and described, it would be appreciated by those skilled in the art that changes might be made in these embodiments without departing from the principles and spirit of the invention, the scope of which is defined in the claims and their equivalents.

What is claimed is:

1. An organic light emitting display, comprising:
   an organic light emitting diode coupled to a transistor and including a first electrode, an organic thin film layer and a second electrode;
   a photodiode formed on a substrate and comprising a semiconductor layer including a high-concentration P doping region, an intrinsic region with defects and a high-concentration N doping region;
   a reflective layer formed between an upper surface of the substrate and a lower surface of the photodiode that reflects light incident from an exterior of the organic light emitting diode onto the photodiode
   an interlayer insulator formed on the photodiode; a light receiver formed on the intrinsic region by etching a region of the interlayer insulator and exposing the intrinsic region.

2. The organic light emitting display according to claim 1, wherein the reflective layer comprises a metal selected from the group consisting of Ag, Mo, Ti, Al and Ni.

3. The organic light emitting display according to claim 1, wherein the reflective layer has a thickness of 100 to 5000 Å.

* * * * *